United States Patent
Kallscheuer et al.

(10) Patent No.: US 7,461,308 B2
(45) Date of Patent: Dec. 2, 2008

(54) METHOD FOR TESTING SEMICONDUCTOR CHIPS BY MEANS OF BIT MASKS

(75) Inventors: Jochen Kallscheuer, Munich (DE); Udo Hartmann, Neuried (DE); Patric Stracke, Munich (DE)

(73) Assignee: Infineon Technologies AG, Munich (DE)

( * ) Notice: Subject to any disclaimer, the term of this patent is extended or adjusted under 35 U.S.C. 154(b) by 415 days.

(21) Appl. No.: 11/287,605

(22) Filed: Nov. 28, 2005

(65) Prior Publication Data
US 2006/0156107 A1    Jul. 13, 2006

(30) Foreign Application Priority Data
Nov. 29, 2004    (DE)    ............. 10 2004 057 483

(51) Int. Cl.
*G01R 31/28*    (2006.01)
(52) U.S. Cl. ............... 714/726; 714/5; 714/25; 714/30; 714/42; 714/709; 714/715; 714/718; 714/719; 714/720; 714/722; 714/724; 714/727; 714/728; 714/729; 714/733; 714/734; 714/736; 714/738; 714/739; 714/742; 714/745; 365/201
(58) Field of Classification Search ............... None
See application file for complete search history.

(56) References Cited
U.S. PATENT DOCUMENTS 5,784,382 A * 7/1998 Byers et al. ............ 714/726
6,574,762 B1 * 6/2003 Karimi et al. .............. 714/727
6,715,105 B1 * 3/2004 Rearick .................... 714/30
7,139,946 B2 * 11/2006 Nadeau-Dostie et al. .... 714/720
7,213,183 B2 * 5/2007 Gossman .................. 714/724
2002/0010878 A1 * 1/2002 Ernst et al. .................. 714/25
2003/0167431 A1 * 9/2003 Nicolaidis et al. ............ 714/733
2005/0240848 A1 * 10/2005 Cote et al. .................. 714/726
2006/0156108 A1 * 7/2006 Stracke et al. ............... 714/724

FOREIGN PATENT DOCUMENTS

| DE | 10102871 | 8/2002 |
| DE | 10124735 | 11/2002 |
| DE | 10223167 | 12/2003 |
| DE | 10231680 | 2/2004 |

* cited by examiner

Primary Examiner—John P Trimmings
(74) Attorney, Agent, or Firm—Dicke, Billig & Czaja, PLLC

(57) ABSTRACT

A method for testing semiconductor chips is disclosed. In one embodiment, a chip to be tested which has a test logic, at least one test mode is set, the test modes are executed in the chip and test results or the status of the test modes are output from the chip. The method includes providing a chip having at least one first register set having a plurality of registers and at least one second register set having a plurality of registers, at least one register of the first register set and at least one register of the second register set being 1:1 logically combined with one another. A first serial bit string is stored, the bit sequence of which can be assigned to at least one test mode, in the first register set. A bit sequence is transmitted for application of the logical combination between the first register set and the second register set to the first bit string stored in the first register set. The test results are read out by means of a serial second bit string.

22 Claims, 3 Drawing Sheets

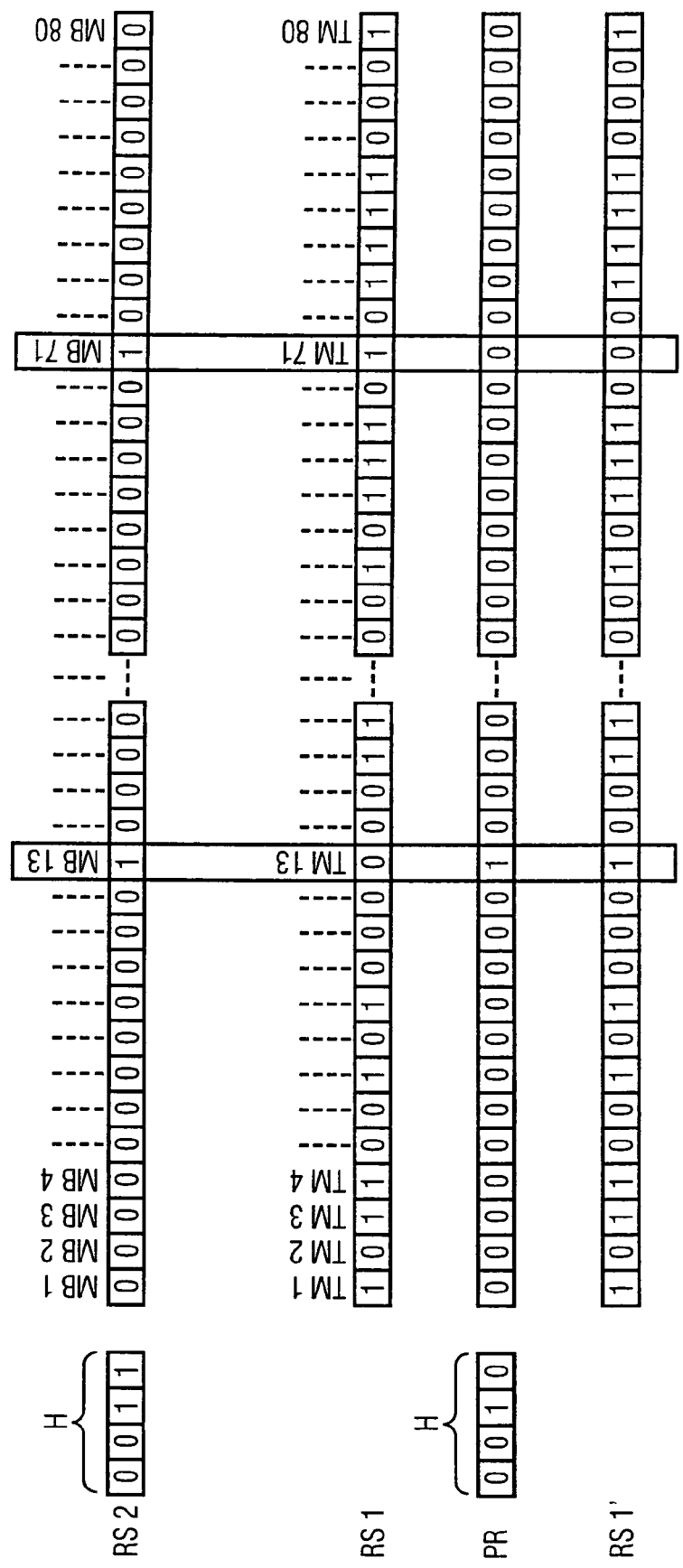

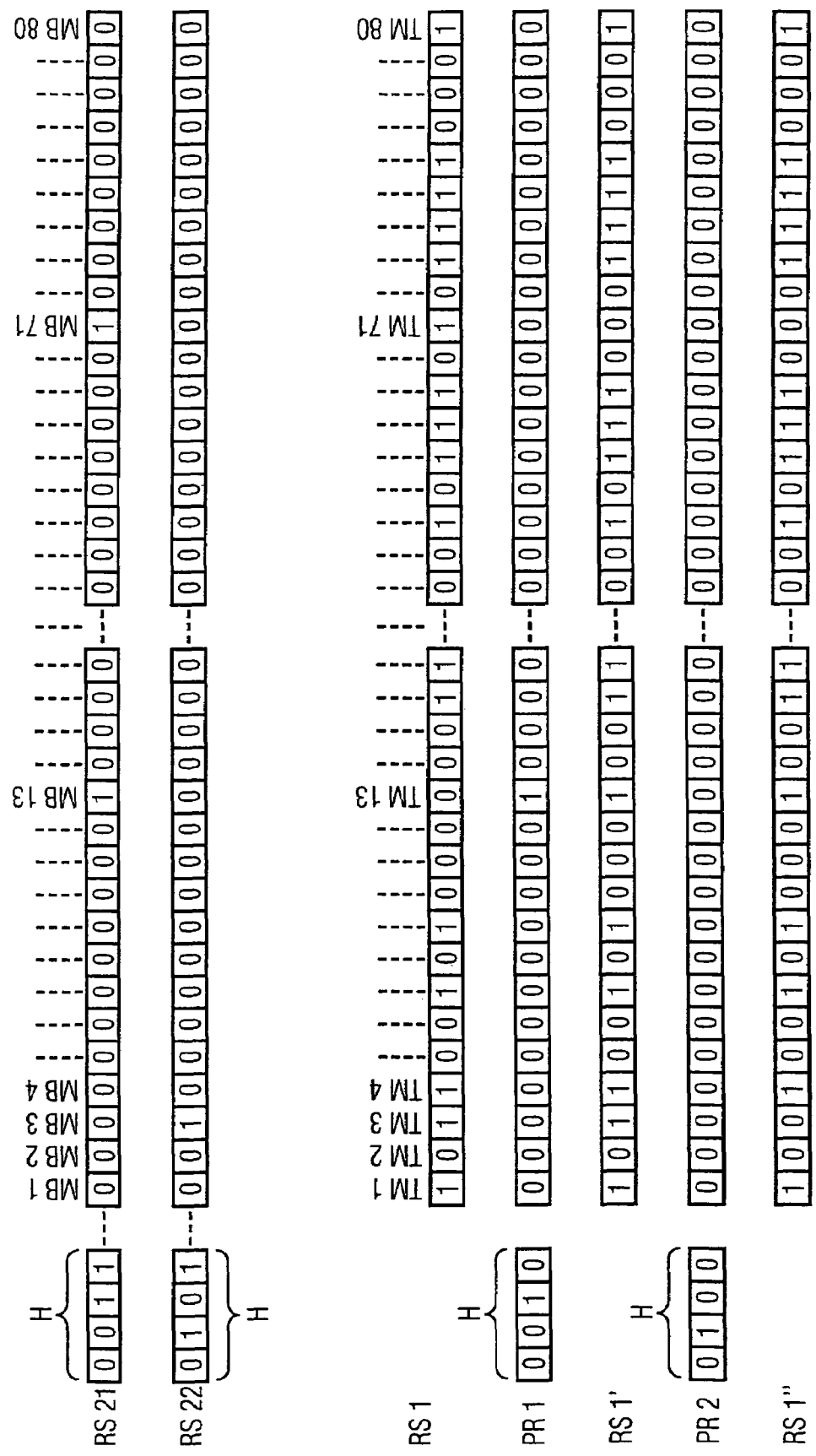

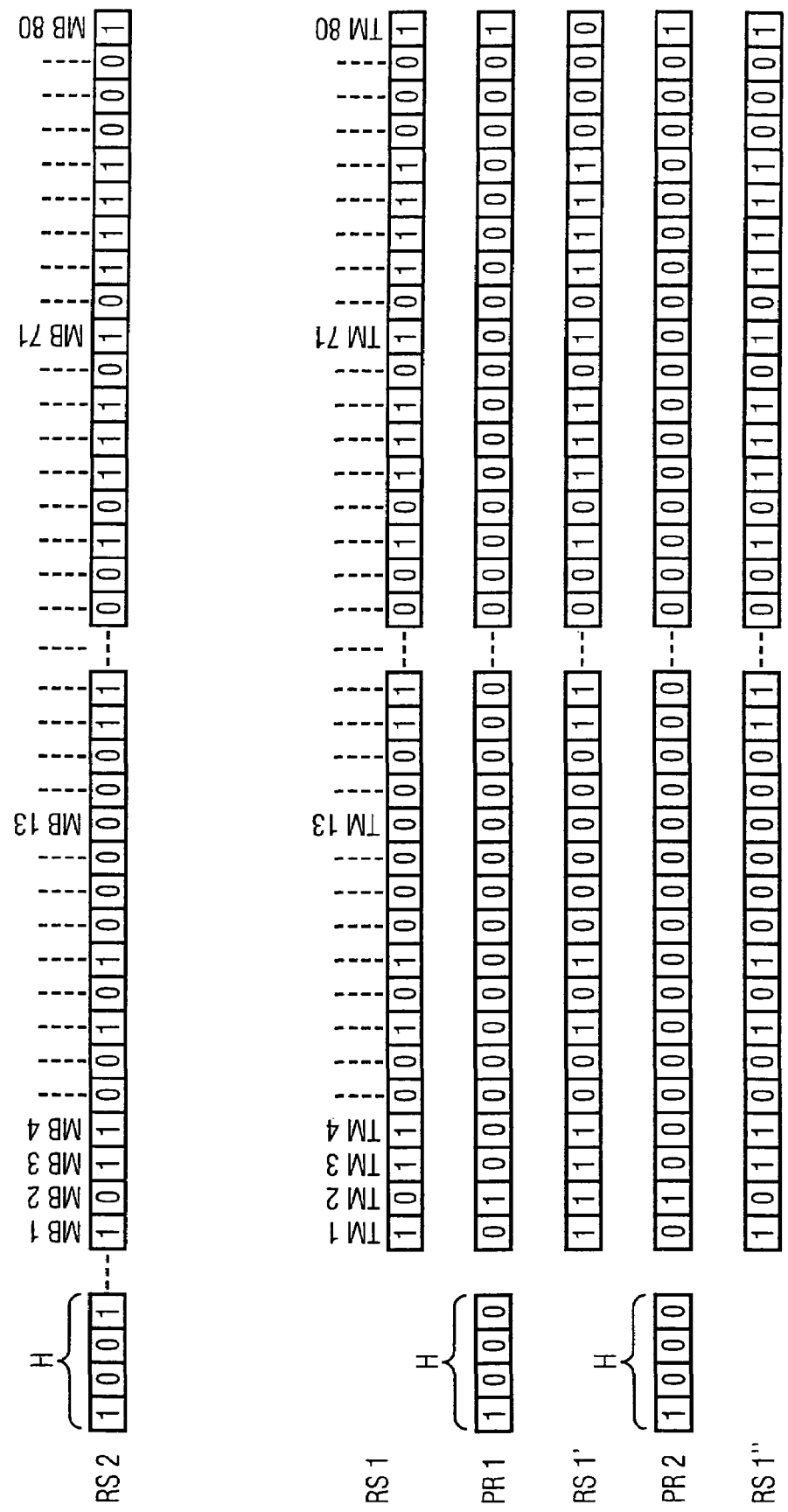

METHOD FOR TESTING SEMICONDUCTOR CHIPS BY MEANS OF BIT MASKS

CROSS-REFERENCE TO RELATED APPLICATIONS

This Utility Patent Application claims priority to German Patent Application No. DE 10 2004 057 483.9 filed on Nov. 29, 2004, which is incorporated herein by reference.

FIELD OF THE INVENTION

The present invention lies in the technical field of the fabrication of semiconductor chips, in particular memory chips, and relates to a method for testing semiconductor chips in which, in a chip to be tested, a plurality of test modes are set, the test modes are executed and test results or the status of the test modes are subsequently output.

BACKGROUND

An essential part of the fabrication of semiconductor chips, in particular memory chips, is testing the quality of the fabricated chip. In the context of quality assurance, tests are often carried out simultaneously on a multiplicity of chips as early as at the wafer level, in order to segregate defective chips or to be able to initiate corresponding repair measures as early as possible.

In modern chipmaking, in customary test methods by means of a tester a multiplicity of test modes are set (loaded) into the chip(s) to be tested and are executed and the test results are output to the tester. In this case, the test modes may be stored in the respective tester; chips are often also equipped with a corresponding test logic in which, inter alia, various test modes may also be stored.

Nowadays test modes are usually set in the chip to be tested via a serial interface with the aid of a bit string in which respective bit sequences are in each case allocated to a specific test mode. By means of the bit string, the test modes are activated/deactivated, for example, or specific parameters are set in a respective test mode, whereby a test mode can be altered or, by way of example, specific subfunctions of a test mode can be activated/deactivated. In this case, a complete bit string is always transmitted serially, the bit string including the bit sequences of all the test modes even if only a specific test mode is to be executed or changed.

On account of the ever more complex structure of the chips which accompanies advancing miniaturization, ever more extensive tests have to be performed with regard to the required quality assurance. However, this has the effect that the serially supplied bit strings generally become very long and the setting or changing of individual or a plurality of test modes accordingly takes up very much time and, under certain circumstances, may even become time-critical. This problem occurs primarily when one or more test modes are changed over multiply during a test, which in practice may indeed be the case several thousand times per test. This means in practice that owing to time problems tests can often only be carried out inadequately or not at all, with the result that it is necessary to reckon with an increased rate of deficient chips that have reached the market. Furthermore, the very long bit strings required for complex chip structures cannot be handled by all test systems, since the bit width of all the registers in a test system is limited with regard to hardware. This can lead to significant overhead times in production.

SUMMARY

The present invention provides a method for testing semiconductor chips. In one embodiment, the method includes providing a chip having at least one first register set having a plurality of registers and at least one second register set having a plurality of registers, at least one register of the first register set and at least one register of the second register set being 1:1 logically combined with one another. A first serial bit string is stored, the bit sequence of which can be assigned to at least one test mode, in the first register set.

A bit sequence is transmitted for application of the logical combination between the first register set and the second register set to the first bit string stored in the first register set. The test results or the status of test modes are read out by means of a serial second bit string.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 schematically illustrates a first exemplary embodiment of the method according to the invention.

FIG. 2 schematically illustrates a second exemplary embodiment of the method according to the invention.

FIG. 3 schematically illustrates a third exemplary embodiment of the method according to the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The object of the present invention provides a method for testing semiconductor chips, in particular memory chips, which makes it possible to effect the setting or changing of test modes or the control of test mode functions and the read-out of test results or of the status of test modes (or of the values of trimming test modes) using serial interfaces more rapidly or in a shorter period of time than in the case of the conventional method.

In one embodiment, the invention illustrates a method for testing semiconductor chips, in particular memory chips, in which, in a chip which is equipped with a test logic and is to be subjected to a test, at least one test mode, generally a plurality of test modes, is set with the aid of a serial interface. The test modes are executed in the chip, and test results or the status of test modes (or the values of trimming test modes) are output from the chip with the aid of a serial interface.

When carrying out a method according to the invention, a chip to be tested is provided, which comprises, besides a test logic, at least one first register set having a plurality of registers and at least one second register set having a plurality of registers, the number of registers in the first register set and the number of registers in the second register set generally being identical. At least one register of the first register set and at least one register of the second register set are 1:1 logically combined with one another, all logical combination possibilities, such as AND, OR, EXCLUSIVE-OR, NOT, NAND, NOR, being taken into consideration. It may be advantageous if all the registers of the first and second register sets are logically combined with one another. On account of its frequent occurrence, an inversion of logic states is preferred according to the invention, but without being restricted to this.

In accordance with one embodiment of the invention, it is accordingly possible for one first register set together with one second register set, that is to say at least in each case one register of the two register sets, to be logically combined with one another. Equally, it is possible for one first register set together with a plurality of second register sets, that is to say with at least one register thereof, to be logically combined with one another. It is likewise possible for a plurality of first register sets to be present which are in each case inherently respectively logically combined together with one or a plurality of second register sets or at least with one register thereof.

In another embodiment of the invention, the second register set is freely programmable, that is to say that the logical combination between the registers of the first and second register sets can be activated or deactivated, depending on the logic state of the associated bit.

In one embodiment, the registers are conventional latch storage devices, for example, in which a bit can in each case be stored.

In accordance with a method of the present invention, a first serial bit string, the bit sequence of which can be assigned to at least one test mode, is stored in the first register set. In this embodiment, the first serial bit string may be transmitted externally from outside the chip by means of a serial interface. As an alternative, the first serial bit string may also be generated internally within the chip and be stored in the first register set. If a plurality of first register sets are present, a first serial bit string may be stored in each of the register sets.

This is followed by the transmission of a test mode change bit sequence (or header or start code) for application of the logical combination between the first register set and the second register set to the first bit string, stored in the first register set, externally from outside the chip, for example by means of a tester. The transmission of the test mode change bit sequence has the effect that the logical operation which results from the logical combination between the second register set and the first register set is carried out on the first bit string stored in the first register set, to be precise for those registers of the two register sets between which a logical combination exists and, if appropriate, is activated.

After changing the logic state of at least one bit of the first bit string, the changed test mode or the changed test mode function is executed and the test results or the status of test modes (or the values of trimming test modes) are output by means of a serial second bit string via a serial interface.

In one embodiment of the method according to the invention, the second register set provides a bit mask which is advantageously programmable and by means of which, for the purpose of changing one or more test modes or one or more test mode functions, a logical operation is effected on one or a plurality of registers of the first register set, in which the bit sequence of the first bit string is stored. Instead of storing in the first register set a complete first bit string in which the intended changes to test modes/test mode functions are implemented, it is sufficient for the realization of the above changes insofar as only the corresponding bit mask (second register set) is activated, whereby the logical operations which correspond to the intended changes to test modes/test mode functions are executed on the first bit string. The addressing of the corresponding second register set may be effected by means of a corresponding short bit sequence (e.g. 4-bit header), so that time can be saved in comparison with the conventional method, in which the complete bit string (for example 250-300 bits) would have to be communicated. In particular, an individual test mode can be switched on and off as often as desired in this way. If such a procedure is desirable for another test mode, the second register set can be reprogrammed in a simple manner. Each first or second register set can be unambiguously accessed by means of a corresponding address.

The second register sets can be reprogrammed at any time, including while a test method is being carried out. Equally, it is possible for the second register sets to be brought to a definable initial state (default state).

In accordance with another embodiment of the method according to the invention, at least one of the m first bit strings and/or the second bit string may be provided with at least one binary check bit. For the case where the binary check bit is in a first one of its two logic states (the check bit is not "set"), which is represented e.g. by the logic value "0", the check bit has the effect that the test logic skips the bits of the relevant bit string which follow the check bit until the test logic detects a further check bit of the relevant bit string which is in the other, second, logic state, represented e.g. by the logic value "1". In another embodiment, for the case where the binary check bit is in the second one of its two logic states (the check bit is "set"), this check bit has the effect that the test logic does not skip the bits of the relevant bit string which follow said check bit and reads them in until the test logic detects a further check bit of the bit string which is in the other, first logic state.

With the aid of the method according to the invention, it is thus possible to subdivide the entire bit string into a plurality of bit sequences with the aid of check bits, the bits of the respective bit sequences, depending on the logic state of their preceding check bits, being skipped by the test logic or being read in by the test logic and output as test result or as status of test modes (or values of trimming test modes). In other words, only the bits of the bit sequences with a set check bit are read into the test logic, while the bits of the bit sequences with a non-set check bit are not read into the test logic, so that only determined or determinable test modes or test mode functions can be controlled without all the bits of the complete bit string having to be read into the test logic. Equally, when outputting test results, it is possible to set only those check bits which are associated with those bit sequences of the test modes or test mode functions for which the test results are intended to be output.

Since the bits of the bit sequences with the non-set check bits can be skipped by the test logic both during the inputting and during the outputting of the bit strings, it is thus possible, to save time when programming the register groups or when outputting the test results.

In on embodiment of a method according to the invention, the bit sequences preceded by a check bit may be assigned to one or more test modes, in which embodiment the bits of a bit sequence preceded by a check bit may be assigned only to an individual test mode. The test modes can be activated/deactivated by the bits of the bit sequences assigned to them. It is equally possible for parameters of the test modes to be changed by the bits of the bit sequences assigned to the test modes, whereby specific functions may be changed or specific subfunctions may be activated/deactivated.

Furthermore, in one embodiment of the method according to the invention, the bit sequences preceded by a check bit may be assigned to one or more test mode functions, in which case the bits of a bit sequence preceded by a check bit be assigned only to an individual test mode function. The test mode functions can be activated/deactivated by the bits of the bit sequences assigned to them. It is equally possible for the test mode functions to be changed thereby.

In one embodiment of the method according to the invention, a check bit precedes the first and/or second bit string, which may have the effect that the bits of the complete bit string, depending on whether or not the check bit is set, are read in by the test logic or skipped by the test logic. This may be helpful, for example, if a plurality of different bit strings are transmitted all at once serially to the chip to be tested, or a plurality of different bit strings are output all at once by the chip, but only individual ones thereof are intended to be taken into account. In this embodiment, the check bit may precede a bit string header identifying the bit string.

In one embodiment of the method according to the invention, a complete bit string may be preceded by a check bit, which has the effect that the bits of the bit string, depending on whether or not the check bit is set, are read into/out of the test logic or are skipped by the test logic. One, a plurality or all of the bit sequences which may be assigned to at least one or an individual test mode may be preceded by a check bit, which has the effect that the bits of the bit sequences, depending on whether or not the check bit is set, are read into/out of the test logic or are skipped by the test logic. One, a plurality or all of the bit sequences which may be assigned to at least one or only one individual test mode function may be preceded by a check bit, which has the effect that the bits of the bit sequences, depending on whether or not the check bit is set, are read into/out of the test logic or are skipped by the test logic. In the case of the last-mentioned measure, the expression "test mode functions" is also intended to encompass test mode subfunctions, that is to say further differentiations of test mode functions, which are also test mode functions in the actual sense.

The above subdivision of the complete bit string into ever smaller bit sequences each preceded by a check bit thus enables test modes or test mode functions to be controlled in a targeted manner by setting only the check bits of the associated bit sequences. This subdivision of the bit string into ever smaller bit sequences is limited, however, from the standpoint of saving time during the serial transmission of the bit string between a test apparatus and the chip to be tested, to the effect that at least one bit of a bit sequence can be skipped by the test logic. In this respect, it makes no sense for each bit of a bit string to be preceded by a set check bit since this does not give rise to a time saving compared with the conventional transmission of a bit string. In other words, a bit sequence which is assigned to a test mode or a test mode function should contain at least two bits.

The method according to embodiments of the invention is not restricted in any regard whatsoever in terms of its application. It is mentioned merely as an example that voltages or electric currents can be trimmed by means of the method according to the invention.

Reference is made to FIG. 1, which schematically illustrates a first exemplary embodiment of a method according to the invention. It is assumed in this case that the chip contains a first register set and a second register set, the registers of which are 1:1 logically combined with one another by means of an inversion operation. In this embodiment, the second register set is freely programmable.

In one embodiment of the method according to the invention, firstly a bit mask is programmed in the form of a bit sequence RS2 for the second register set. The bit sequence RS2 comprises a header H, and also 80 mask bits MB1, MB2, ..., MB80, only two bits of which are set, i.e. have the logic value 1, namely MB13 and MB71. This means that it is only for the mask bits MB13 and MB71 that an inversion takes place at the corresponding bits, i.e. bits logically combined therewith, of the first register set.

Prior to a change (reprogramming), a first bit string RS1 is situated in the first register set. The first bit string RS1 includes 80 bits which are each allocated a test mode, i.e. TM1, TM2, ..., TM80. The test modes are subsequently programmed by a bit sequence PR being transmitted to the chip.

The bit sequence PR has the effect that the bit mask, that is to say the logical operations of the second register set, are applied to the first register set. This finally leads to a first bit string RS1' in the first register set, in the case of which the bits 13 and 71 for the test modes TM13 and TM71 are inverted relative to the first bit string RS1. Through application of the bit mask (second register set) it is thus possible, in a simple manner, to carry out those changes on the test modes TM13 and TM71 which correspond to an inversion of the associated bits. This may involve, by way of example, an activation/deactivation of these test modes. The rectangular frames identify the bits at which an inversion is performed.

FIG. 2 schematically illustrates a second exemplary embodiment of a method according to the invention, only the differences with respect to the exemplary embodiment of FIG. 1 are explained in order to avoid unnecessary repetition. In the example of FIG. 2, two bit masks (i.e., two second register sets) are provided. These are firstly programmed with the two bit sequences RS21 and RS22. By means of the programming, in the first bit mask the mask bit MB13 and the mask bit MB71 are set (logical state "1") by RS21, i.e., an inversion is effected only for these mask bits. On the other hand, by means of the programming, in the second bit mask the mask bit MB3 is set (logic state "1") by RS22, i.e. an inversion is effected only for this mask bit. RS1 illustrates the first bit string, which is situated in the first register set before the bit masks are activated. The first bit mask is activated by the bit sequence PR1, which has the effect that the bits of the test modes TM13 and TM71 are inverted. An altered first bit string RS1' is produced as a result. On the other hand, the second bit mask is activated by the bit sequence PR2, which has the effect that the bit of the test mode TM3 is inverted. An altered first bit string RS1" is produced as a result.

FIG. 3 schematically illustrates a third exemplary embodiment of a method according to the invention, only the differences with respect to the exemplary embodiment of FIG. 1 being explained in order to avoid unnecessary repetition. In the exemplary embodiment of FIG. 3, only one bit mask (i.e. one second register set) is provided. In contrast to the exemplary embodiment of FIG. 1, this bit mask (i.e. the logic states of the registers of the second register set) are generated internally within the chip on the basis of a test mode. Accordingly, a multiplicity of mask bits are set, among them the mask bits MB1 and MB3.

RS1 illustrates the first bit string, which is situated in the first register set before the bit mask is activated. The first bit mask is activated by the bit sequence PR1, which has the effect that the bits of the test modes TM2 and TM80 are inverted. An altered first bit string RS1' is produced as a result. The first bit mask is activated anew by the bit sequence PR2, which has the effect that the bits of the test modes TM2 and TM80 are inverted anew. A first bit string RS1" identical to the first bit string RS1 is produced as a result. In this way, it is possible to switch back and forth between the different states of the test modes in a very simple manner.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for testing semiconductor chips comprising:
   providing a chip having at least one first register set having a plurality of registers and at least one second register set having a plurality of registers, at least one register of the first register set and at least one register of the second register set being 1:1 logically combined with one another;
   storing a first serial bit string, the bit sequence of which can be assigned to at least one test mode, in the first register set;
   transmitting a bit sequence for application of the logical combination between the at least one register of the first register set and the at least one register of the second register set to the first serial bit string stored in the first register set; and
   reading out test results or a status of the test modes by means of a second serial bit string.

2. The method of claim 1, comprising:
   defining a logical 1:1 combination between all the registers of the first and second bit strings.

3. The method of claim 1, comprising:
   programming the registers of the second register set for the activation/deactivation of their logical combination.

4. The method of claim 1, comprising:
   transmitting the first serial bit string stored in the first register set externally from outside the chip.

5. The method of claim 1, comprising:
   programming the registers of the second register set for the activation/deactivation of their logical combination.

6. The method of claim 1, comprising:
   transmitting the first serial bit string stored in the first register set externally from outside the chip.

7. The method of claim 1, comprising:
   generating the first serial bit string stored in the first register set internally within the chip.

8. The method of claim 1, comprising:
   defining the logical 1:1 combination of the registers to be an inversion.

9. A method for testing semiconductor memory chips in which in a chip to be tested which has a test logic, at least one test mode is set, the test mode is executed in the chip and test results or a status of the test mode is output from the chip, comprising:
   providing the chip having at least one first register set having a plurality of registers and at least one second register set having a plurality of registers, at least one register of the first register set and at least one register of the second register set being 1:1 logically combined with one another;
   storing a first serial bit string, the bit sequence of which can be assigned to at least one test mode, in the first register set;
   transmitting a bit sequence for application of the logical combination between the at least one register of the first register set and the at least one register of the second register set to the first serial bit string stored in the first register set; and
   reading out test results or a status of the test mode by means of a second serial bit string.

10. The method of claim 9, comprising:
    defining a logical 1:1 combination between all the registers of the first and second serial bit strings.

11. A method for testing semiconductor memory chips in which in a chip to be tested which has a test logic, at least one test mode is set, the test mode is executed in the chip and test result or a status of the test mode is output from the chip, comprising:
    providing the chip having at least one first register set having a plurality of registers and at least one second register set having a plurality of registers, at least one register of the first register set and at least one register of the second register set being 1:1 logically combined with one another;
    storing a first serial bit string, the bit sequence of which can be assigned to at least one test mode, in the first register set;
    transmitting a bit sequence for application of the logical combination between the at least one register of the first register set and the at least one register of the second register set to the first serial bit string stored in the first register set; and
    reading out test results or a status of the test mode by means of a second serial bit string;
    further comprising providing the first serial bit string with at least one binary check bit, the test logic being controlled by a first check bit which is in a first logic state such that the bits of the first serial bit string which follow the first check bit are skipped until a second check bit which is in a second logic state is detected by the test logic, and the test logic being controlled by the second check bit which is in the second logic state such that the bits of the first serial bit string which follow the second check bit are not skipped until the first check bit which is in the first logic state is detected by the test logic.

12. The method of claim 11, wherein:
    the second serial bit string is provided with at least one binary check bit, the test logic being controlled by a first check bit which is in the first logic state such that the bits of the second serial bit string which follow the first check bit are skipped until a second check bit which is in the second logic state is detected by the test logic, and the test logic being controlled by a second check bit which is in the second logic state such that the bits of the second serial bit string which follow the second check bit are not skipped until the first check bit which is in the first logic state is detected by the test logic.

13. The method of claim 11, comprising:
    assigning a first or second check bit preceding a bit sequence of the first or second serial bit string to at least one test mode.

14. The method of claim 11, comprising:

assigning a first or second check bit preceding a bit sequence of the first or second serial bit string to an individual test mode.

15. The method of claim 11, comprising:

assigning a first or second check bit preceding a bit sequence of the first or second serial bit string to at least one test mode function.

16. The method of claim 11, comprising:

assigning a first or second check bit preceding a bit sequence of the first or second serial bit string to an individual test mode function.

17. The method of claim 11, comprising:

provide a first or second check bit preceding at least one first or second bit string.

18. The method of claim 11, comprising:

providing a first or second check bit to precede all of the bit sequences which are assigned to at least one test mode.

19. The method of claim 11, comprising wherein a first or second check bit precedes all of the bit sequences which are assigned to an individual test mode.

20. The method of claim 11, comprising wherein a bit sequence assigned to a test mode is used to activate or deactivate this test mode.

21. The method of claim 11, comprising wherein a bit sequence assigned to a test mode or test mode function is used to set parameters of this test mode.

22. A semiconductor chip test system, comprising:

a chip having at least one first register set having a plurality of registers and at least one second register set having a plurality of registers, at least one register of the first register set and at least one register of the second register set being 1:1 logically combined with one another;

means for storing a first serial bit string, the bit sequence of which can be assigned to at least one test mode, in the first register set;

means for transmitting a bit sequence for application of the logical combination between the at least one register of the first register set and the at least one register of the second register set to the first serial bit string stored in the first register set; and means for reading out test results or a status of the test mode by means of a second serial bit string.

* * * * *